United States Patent
Kengeri et al.

(10) Patent No.: US 7,606,061 B2
(45) Date of Patent: Oct. 20, 2009

(54) SRAM DEVICE WITH A POWER SAVING MODULE CONTROLLED BY WORD LINE SIGNALS

(75) Inventors: Subramani Kengeri, San Jose, CA (US); Jhon-Jhy Liaw, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 120 days.

(21) Appl. No.: 11/835,372

(22) Filed: Aug. 7, 2007

(65) Prior Publication Data
US 2009/0040858 A1   Feb. 12, 2009

(51) Int. Cl.
G11C 11/00 (2006.01)
G11C 5/06 (2006.01)
G11C 7/10 (2006.01)
G11C 5/14 (2006.01)

(52) U.S. Cl. ............. 365/154; 365/63; 365/72; 365/189.06; 365/189.11; 365/227

(58) Field of Classification Search ............ 365/154, 365/155, 156, 189.06, 189.11, 227, 229, 365/63, 72
See application file for complete search history.

(56) References Cited

U.S. PATENT DOCUMENTS

| | | | | |
|---|---|---|---|---|
| 5,303,190 A | * | 4/1994 | Pelley, III | 365/189.11 |
| 5,715,191 A | * | 2/1998 | Yamauchi et al. | 365/156 |
| 5,734,604 A | * | 3/1998 | Akamatsu et al. | 365/156 |
| 6,639,828 B2 | * | 10/2003 | Itoh et al. | 365/156 |
| 6,999,371 B2 | * | 2/2006 | Nii | 365/227 |
| 7,158,404 B2 | * | 1/2007 | Lai | 365/154 |
| 7,196,960 B2 | * | 3/2007 | Isoda et al. | 365/227 |
| 7,272,068 B2 | * | 9/2007 | Yamaoka et al. | 365/226 |
| 7,307,907 B2 | * | 12/2007 | Houston | 365/222 |
| 7,428,164 B2 | * | 9/2008 | Yamaoka et al. | 365/154 |

* cited by examiner

*Primary Examiner*—Ly D Pham
(74) *Attorney, Agent, or Firm*—K&L Gates LLP

(57) ABSTRACT

An SRAM device include: a latch unit for retaining data; one or more pass gate transistors controlled by a word line for coupling the latch unit to a bit line and a complementary bit line; and a power saving module coupled to the latch unit for raising a source voltage of the latch unit in response to a control signal on the word line, thereby reducing a leakage current for the latch unit.

16 Claims, 3 Drawing Sheets

SRAM DEVICE WITH A POWER SAVING MODULE CONTROLLED BY WORD LINE SIGNALS

BACKGROUND

The present invention relates generally to static random access memory (SRAM) devices, and more particularly to an SRAM cell with a power saving module activated by word line signals for reducing leakage current.

SRAM is a type of memory device consisted of a latch storing a value, and pass-gate transistors controlling read/write operation of the latch. In order to ensure that an SRAM device functions properly, the minimum voltage (Vccmin) of a power supply needs to be higher than a predetermined level, which in turns demands a large layout area for an SRAM cell. However, the larger the SRAM cell, the more susceptible it is to leakage current. These conflicting constraints have posed challenges for SRAM designs.

One conventional approach to meeting the challenge is to provide a power saving controller for a bank of SRAM cells. The power saving controller is coupled to all of the source nodes of the SRAM cells in the bank. When the bank is selected for read/write operation, the power saving controller is inactivated and the source nodes of the SRAM cells are coupled to ground. When the bank is not selected, the power saving controller is activated to raise the voltage at the source nodes for all the SRAM cells in the unselected bank. As the voltage at the source nodes are raised, the voltage difference between the drains and sources of the SRAM cells are reduced, thereby reducing the leakage current there between.

The conventional scheme of leakage current reduction still has much room for improvement. The conventional power saving controller controls an entire bank, and does not discriminate among the SRAM cells therein. When a bank is selected, some of the cells may be subject to read/write operation, while others may not. The conventional power saving controller does not provide those unselected cells with an optimal design for reducing leakage current. Moreover, the conventional power saving controller is implemented as a circuit module external to the memory banks of an SRAM device. As the conventional power saving controller is designed to reduce leakage current for all the cells in the bank, it is usually turn out to be large in size and occupy excessive silicon real estate. This causes a design challenge, as the SRAM continues to scale down to 45 nm process and beyond.

As such, what is needed is a SRAM device with an optimal design for reducing leakage current under limited requirement for silicon real estate.

SUMMARY

The present invention discloses an SRAM device with a power saving module activated by word line signals for reducing leakage current. In one embodiment of the present invention, the SRAM device include: a latch unit for retaining data; one or more pass gate transistors controlled by a word line for coupling the latch unit to a bit line and a complementary bit line; and a power saving module coupled to the latch unit for raising a source voltage of the latch unit in response to a control signal on the word line, thereby reducing a leakage current for the latch unit.

The construction and method of operation of the invention, however, together with additional objectives and advantages thereof will be best understood from the following description of specific embodiments when read in connection with the accompanying drawings.

DESCRIPTION

This invention is directed to an SRAM device with a power saving module controlled by word line signals for reducing leakage current when a particular set of SRAM cells are in a standby or power saving mode. The following merely illustrates various embodiments of the present invention for purposes of explaining the principles thereof. It is understood that those skilled in the art will be able to devise various equivalents that, although not explicitly described herein, embody the principles of this invention.

Figure 1:
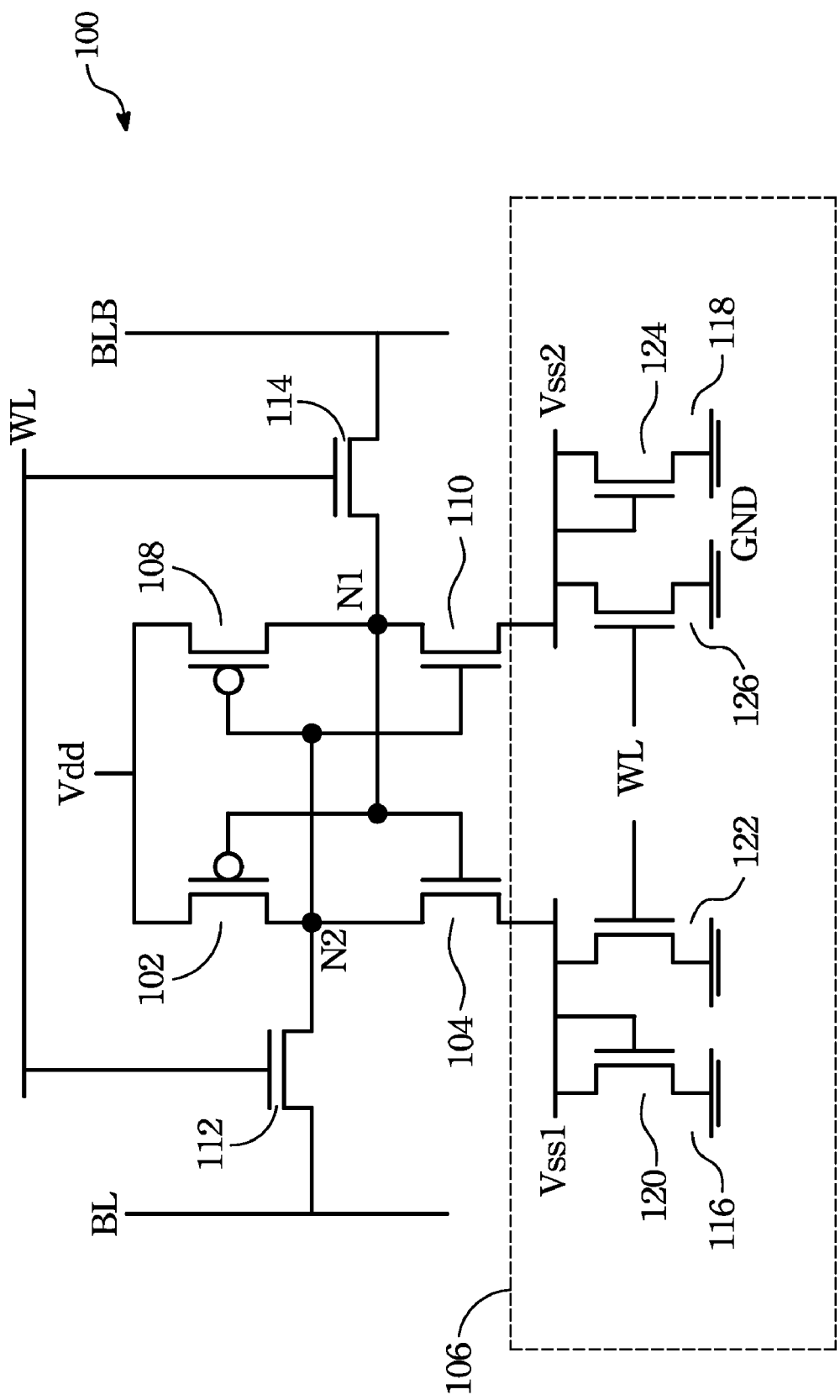
FIG. 1 schematically illustrates an SRAM cell with a proposed power saving module in accordance with one embodiment of the present invention.

FIG. 1 schematically illustrates an SRAM cell 100 with a proposed power saving module in accordance with one embodiment of the present invention. The SRAM cell 100 includes a PMOS transistor 102 and an NMOS transistor 104 serially coupled together in a manner where the source of the PMOS transistor 102 is connected to a supply voltage Vdd and the source of the NMOS transistor 104 is connected to the power saving module 106. Similarly, a PMOS transistor 108 and an NMOS transistor 110 are serially coupled together in a manner where the source of the PMOS transistor 108 is connected to the supply voltage Vdd and the source of the NMOS transistor 110 is coupled to the power saving module 106. The gates of the PMOS transistor 102 and the NMOS transistor 104 are connected with the drains of the PMOS transistor 108 and the NMOS transistor 110 at a first data storage node N1. The gates of the PMOS transistor 108 and the NMOS transistor 110 are connected with the drains of the PMOS transistor 102 and the NMOS transistor 104 at a second data storage node N2, which stores a value complementary to that stored at the first data storage node N1. A pass gate transistor 112 controlled by a word line WL is coupled between the second data storage node N2 and a bit line BL, and another pass gate transistor 114 also controlled by the word line WL is coupled between the first data storage node N1 and a complementary bit line BLB.

The power saving module 106 includes a first power control unit 116 connected to the source of the NMOS transistor 104 via a first source line Vss1, and a second power control unit 118 connected to the source of the NMOS transistor 110 via a second source line Vss2. The first power control unit 116 includes an NMOS transistor 120 with its drain and gate coupled to the first source line Vss1 and its source coupled to ground, and another NMOS transistor 122 with its drain coupled to the first source line Vss1, its source coupled to ground, and its gate controlled by the word line WL. Similarly, the second power control unit 118 includes an NMOS transistor 124 with its drain and gate coupled to the second source line Vss2 and its source coupled to ground, and another NMOS transistor 126 with its drain coupled to the second source line Vss2, its source coupled to ground, and its gate controlled by the word line WL.

The PMOS transistors 102, 108 and the NMOS transistors 104, 110 together function as a latch for storing a value and its complement at the data storage nodes N2 and N1, respectively. When the SRAM cell 100 is selected by raising a control signal on the word line WL to a high voltage state, the pass gate transistors 112, 114 and the NMOS transistors 122, 126 are turned on, thereby allowing the data storage nodes N1 and N2 be accessed by the bit line BL and the complementary bit line BLB, and pulling the voltage on the source lines Vss1 and Vss2 to ground. Assume the voltage on the bit line BL is high and that on the complementary bit line BLB is low. The second storage node N2 is raised to a high level that turns off the PMOS transistor 108 and turns on the NMOS transistor 110. Since the NMOS transistor 126 is turned on, the voltage at the data storage node N1 is pulled to ground. This turns the PMOS transistor 102 on and the NMOS transistor 104 off, thereby sustaining the voltage at the data storage node N2 at a high level.

When the SRAM cell 100 is not selected, the control signal on the word line drops to a low level, turning off the pass gate transistors 112 and 114, as well as the NMOS transistors 122 and 126. The source lines Vss1 and Vss2 are provided with a voltage ranging from 0.05V to 0.6V higher than the ground voltage. Since the NMOS transistors 122 and 126 are turned off, the voltages at the sources of the NMOS transistors 104 and 110 are raised to a level higher than the ground voltage. As a result, the source-drain voltages a across the NMOS transistor 104 is decreased, thereby reducing the leakage current thereof.

It is noted that although the exemplary embodiment describes a six-transistor SRAM cell, the proposed power saving module can be applied to other types of SRAM cells comprised of more than six transistors.

Figure 2:
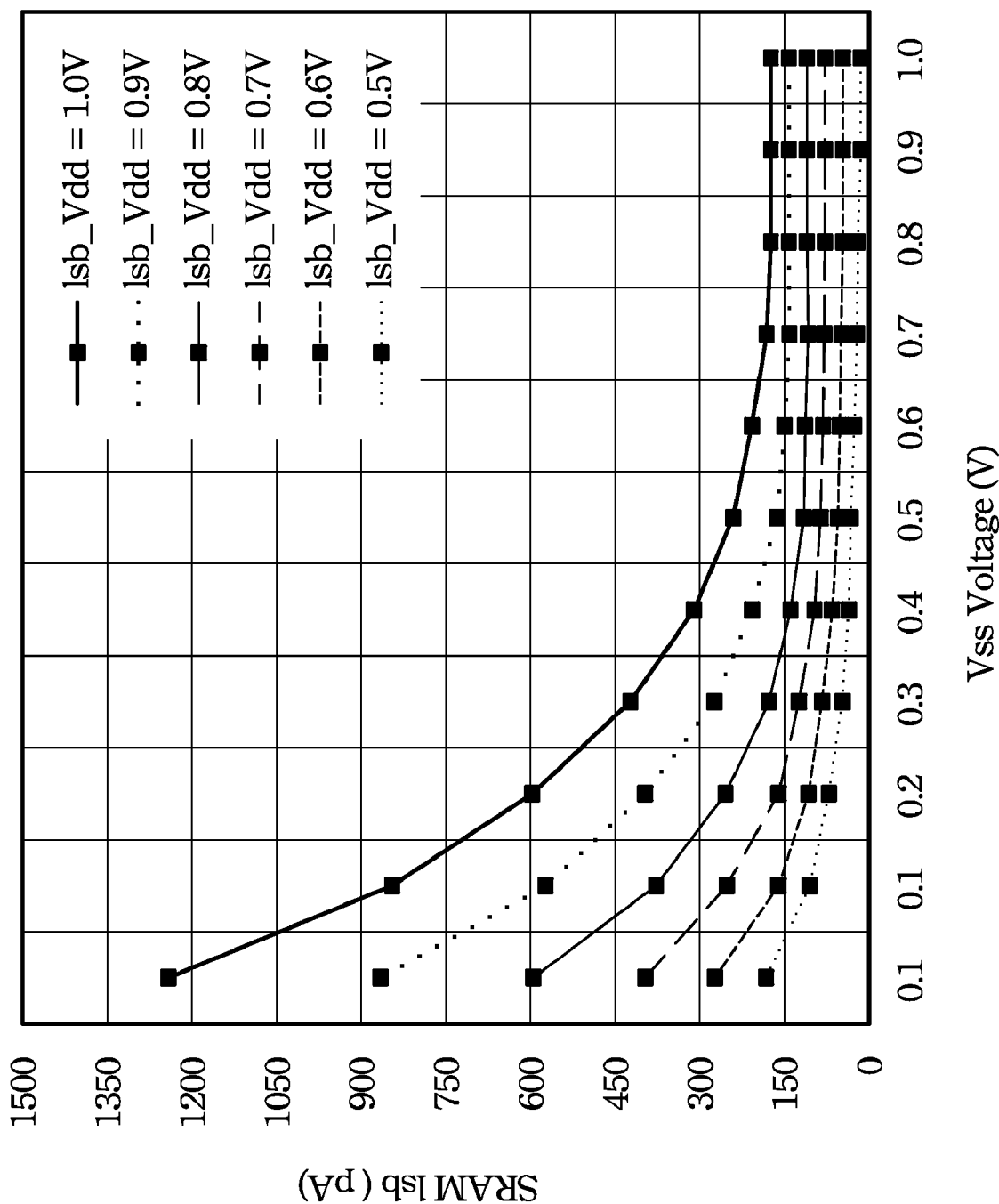
FIG. 2 is a graph showing leakage currents of the proposed SRAM device with respect to various supply voltages Vdd in accordance with one embodiment of the present invention.

FIG. 2 is a graph showing leakage currents of the proposed SRAM device with respect to various supply voltages Vdd in accordance with one embodiment of the present invention. The y-axis represents the leakage current Isb measured in units of pA, and the x-axis represents the voltage level at the source lines of an SRAM device in units of volts. As shown in the graph, the higher the supply voltage Vdd, the higher the leakage current Isb. It is also shown that the higher Vss, the lower the leakage current Isb.

Table 1 below shows the leakage current improvement as the source voltage Vss increases and the core supply voltage CVdd decreases. This table can provide guidance for design optimization. For example, when CVdd equal to 0.7V and Vss is 0.2V, the leakage current reduces by 87%, as opposed to that when CVdd equal to 1.0V and Vss equal to 0.0V.

TABLE 1

| | | | CVdd | | | |
|---|---|---|---|---|---|---|
| Isb improvement % | 1.0 V | 0.9 V | 0.8 V | 0.7 V | 0.6 V | 0.5 V |
| Vss 0.0 V | 0 | 31 | 53 | 68 | 78 | 85 |
| 0.1 V | 32 | 54 | 70 | 80 | 87 | 92 |
| 0.2 V | 53 | 69 | 79 | 87 | 91 | 94 |
| 0.3 V | 66 | 78 | 85 | 90 | 94 | 96 |
| 0.4 V | 75 | 83 | 89 | 92 | 95 | 96 |
| 0.5 V | 80 | 86 | 90 | 93 | 95 | 97 |
| 0.6 V | 83 | 88 | 91 | 94 | 96 | 97 |
| 0.7 V | 85 | 89 | 92 | 94 | 96 | 98 |
| 0.8 V | 86 | 89 | 92 | 94 | 96 | 98 |
| 0.9 V | 86 | 90 | 92 | 94 | 96 | 98 |
| 1.0 V | 86 | 90 | 92 | 94 | 97 | 99 |

Figure 3:
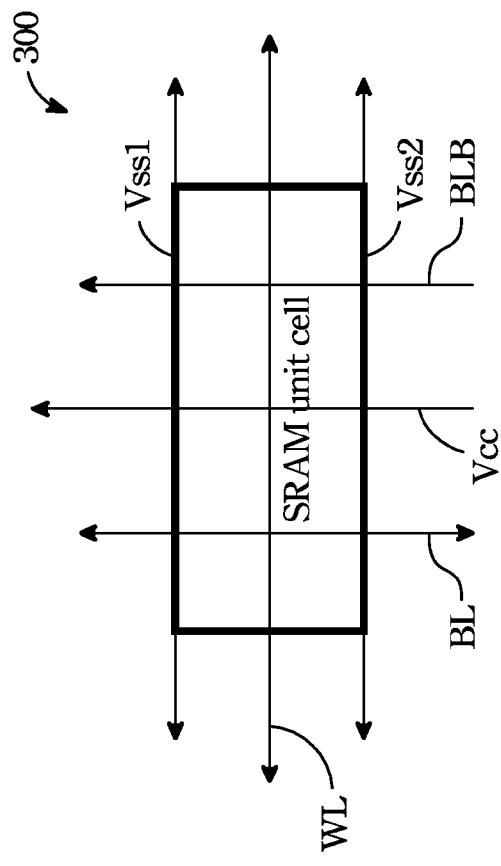
FIG. 3 illustrates a simplified layout view of the proposed SRAM cell in accordance with one embodiment of the present invention.

FIG. 3 illustrates a simplified layout view 300 of the proposed SRAM cell in accordance with one embodiment of the present invention. The word line WL is constructed in a direction substantially perpendicular to that of the bit line BL and the complementary bit line BLB. The power line for the core supply voltage Vcc is constructed in a direction in parallel with the bit line BL and the complementary bit line BLB. The source lines Vss1 and Vss2 are constructed in a direction substantially in parallel with that of the word line WL.

Figure 4:
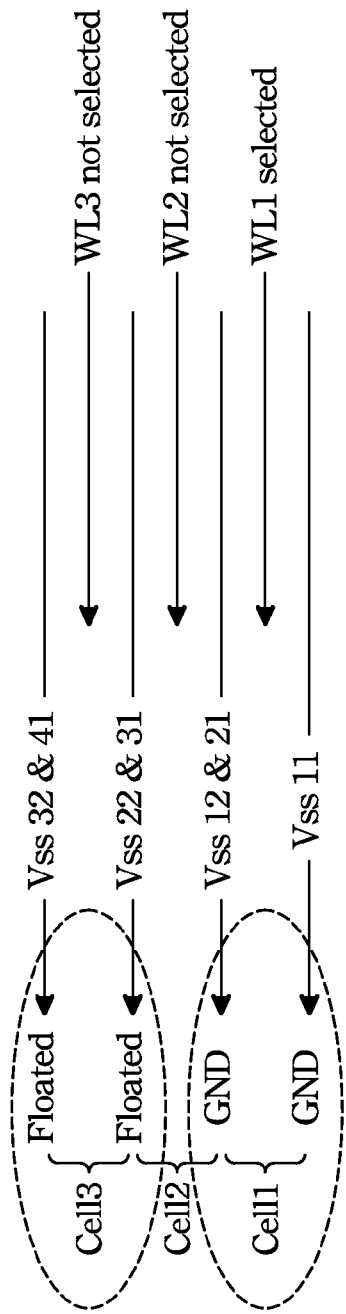
FIG. 4 illustrates a diagram for explaining voltage states at source nodes of the proposed SRAM cells in accordance with one embodiment of the present invention.

FIG. 4 illustrates a diagram for explaining voltage states at Vss nodes of proposed SRAM cells in accordance with one embodiment of the present invention. As shown in the diagram, the source line Vss11 is used by Cell 1, the source line Vss12/21 is shared by Cell 1 and Cell 2, the source line Vss 22/31 shared by Cell 2 and Cell 3, and the source line Vss32/41 shared by Cell 3 and Cell 4 (not shown in the figure). When Cell 1 is selected for read or write operation, the source lines Vss11 and Vss12/21 are coupled to ground, and the source lines for other cells, such as Cell 3, are raised to a voltage level above ground for reducing leakage current. Since the source line V12/21 is shared by neighboring cells Cell 1 and Cell 2, and the source line V22/31 is shared by neighboring cells Cell 2 and Cell 3, Cell 2 has one source line grounded and another raised to a higher level. However, because the voltage on the source is raised only slightly higher than the ground voltage, it will not disturb the value stored at the data storage nodes of the memory cell.

The proposed invention can save power significantly by reducing leakage current at the cell level, which is a significant improvement as opposed to the prior art that can only reduce leakage currents for a selected bank of cells. Moreover, the proposed power saving module allows the minimum supply voltage Vccmin to remain at a proper level without compromising on leakage current reduction. This is critical for a future generation of ICs, for example manufactured by technology beyond 45 nm, that continue to shrink in size.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A static random access memory (SRAM) device comprising:
   a latch unit for retaining data;
   one or more pass gate transistors controlled by a word line for coupling the latch unit to a bit line and a complementary bit line, wherein the latch unit further comprises:
   a first PMOS transistor having a source coupled to a supply voltage;
   a first NMOS transistor having a drain and a gate coupled to a drain and a gate of the first PMOS transistor, respectively;
   a second PMOS transistor having a source coupled to the supply voltage; and
   a second NMOS transistor having a drain and a gate coupled to a drain and a gate of the second PMOS transistor, respectively; and a power saving module coupled to the latch unit for raising a source voltage of the latch unit in response to a control signal on the word line, thereby reducing a leakage current for the latch unit, wherein the power saving module comprises a first source line coupled to a source of the first NMOS transistor, and a second source line coupled to a source of the second NMOS transistor.

2. The SRAM device of claim 1 wherein the first and second source lines are laid out in the same direction as that of the word line controlling the pass gate transistors.

3. The SRAM device of claim 1 wherein the first or second source line is shared by two neighboring SRAM cells.

4. The SRAM device of claim 1 wherein the first and second source lines are in parallel to the word line.

5. The SRAM device of claim 1 wherein the power saving module comprises a first power control unit coupled between the first source line and ground for raising the source voltage inversely responsive to the control signal on the word line.

6. The SRAM device of claim 5 wherein the first power control unit comprises a third NMOS transistor having a drain and a gate coupled to the first source line, and a source coupled to ground.

7. The SRAM device of claim 6 wherein the first power control unit comprises a fourth NMOS transistor having a drain coupled to the first source line, a gate coupled to the word line, and a source coupled to ground.

8. The SRAM device of claim 7 wherein the power saving module comprises a second power control unit coupled between the second source line and ground for raising the source voltage inversely responsive to the control signal on the word line.

9. The SRAM device of claim 8 wherein the second power control unit comprises a fifth NMOS transistor having a drain and a gate coupled to the second source line, and a source coupled to ground.

10. The SRAM device of claim 9 wherein the second power control unit comprises a sixth NMOS transistor having a drain coupled to the second source line, a gate coupled to the word line, and a source coupled to ground.

11. The SRAM device of claim 10 wherein the first and second source lines are at a voltage level ranging from 0.05V to 0.6V, when the control voltage on the word line is low, and the fourth and sixth NMOS transistors are turned off.

12. A static random access memory (SRAM) device having a plurality of SRAM cells, each of which comprises:
a first PMOS transistor having a source coupled to a supply voltage;
a first NMOS transistor having a drain and a gate coupled to a drain and a gate of the first PMOS transistor, respectively;
a second PMOS transistor having a source coupled to the supply voltage;
a second NMOS transistor having a drain and a gate coupled to a drain and a gate of the second PMOS transistor, respectively, the gates of the first NMOS and PMOS transistors being coupled to the drains of the second NMOS and PMOS transistors to form a data storage node, and the gates of the second NMOS and PMOS transistors being coupled to the drains of the first NMOS and PMOS transistors to form a complementary data storage node;
a first pass gate transistor controlled by a word line for selectively coupling the data storage node to a bit line;
a second pass gate transistor controlled by the word line for selectively coupling the complementary data storage node to a complementary bit line; and
a power saving module coupled to sources of the first and second NMOS transistors for raising their source voltages when a control signal on the word line is low, thereby reducing a leakage current from the power supply to the sources of the first and second NMOS transistors, and
wherein the power saving module comprises a first source line coupled to the source of the first NMOS transistor, and a second source line coupled to the source of the second NMOS transistor.

13. The SRAM device of claim 12 wherein the first and second source lines are laid out in the same direction as that of the word line controlling the pass gate transistors.

14. The SRAM device of claim 12 wherein the first or second source line is shared by two neighboring SRAM cells.

15. The SRAM device of claim 12 wherein the power saving module comprises a first power control unit coupled between the first source line and ground, and a second power control unit coupled between the second source line and ground, for raising the source voltage inversely responsive to the control signal on the word line.

16. The SRAM device of claim 15 wherein the first or second power control unit comprises:
a third NMOS transistor having a drain and a gate coupled to the first or second source line, and a source coupled to ground; and
a fourth NMOS transistor having a drain coupled to the first or second source line, a gate coupled to the word line, and a source coupled to ground.

* * * * *